United States Patent [19]
Hiraki et al.

[11] Patent Number: 5,333,127
[45] Date of Patent: Jul. 26, 1994

[54] MEMORY CIRCUIT WITH DUAL SENSE AMPLIFIER AND AMPLIFIER CONTROL CIRCUITRY

[75] Inventors: Toshiyuki Hiraki; Masayuki Hata, both of Hyogo, Japan

[73] Assignee: Mitsubishi Denki Kabushiki Kaisha, Tokyo, Japan

[21] Appl. No.: 900,216

[22] Filed: Jun. 17, 1992

[30] Foreign Application Priority Data

Jun. 17, 1991 [JP] Japan .................................. 3-171672

[51] Int. Cl.$^5$ ............................................. G11C 11/34
[52] U.S. Cl. ...................................... 365/208; 365/49; 365/207
[58] Field of Search .................. 365/49, 199, 206, 207, 365/208, 230.08; 307/530, 231

[56] References Cited

U.S. PATENT DOCUMENTS

| | | | |
|---|---|---|---|
| 4,509,147 | 4/1985 | Tanimura et al. | 365/207 |
| 4,723,224 | 2/1988 | Van Hulett et al. | 365/49 |
| 5,034,636 | 7/1991 | Reis et al. | 365/49 |

FOREIGN PATENT DOCUMENTS 0119090  5/1988  Japan ........................................ 365/49

Primary Examiner—Eugene R. LaRoche
Assistant Examiner—Vu A. Le

[57] ABSTRACT

For performing the coincidence detection between data stored in a memory and comparison data supplied from an external at a high speed, the positive data of a memory $1a$ is transmitted to a positive sense amplifier 2-1, the negative data is transmitted to a negative sense amplifier, and comparison data 5 and the inverted data thereof are respectively inputted as activating signals of the positive and negative sense amplifiers to an activating circuit. Due to the comparison data, the output of the non-activated sense amplifier always becomes "H". On the other hand, the activated sense amplifier senses and outputs its input potential. The output signals of these sense amplifiers are inputted to a coincidence signal outputting circuit to determine a coincidence signal.

5 Claims, 13 Drawing Sheets

MEMORY CIRCUIT WITH DUAL SENSE AMPLIFIER AND AMPLIFIER CONTROL CIRCUITRY

BACKGROUND OF THE INVENTION

1. Field of the Invention

The present invention relates to a semiconductor integrated circuit, and more particularly to a data comparing device for inspecting data stored in a storage device.

2. Description of the Prior Art

Figure 16:
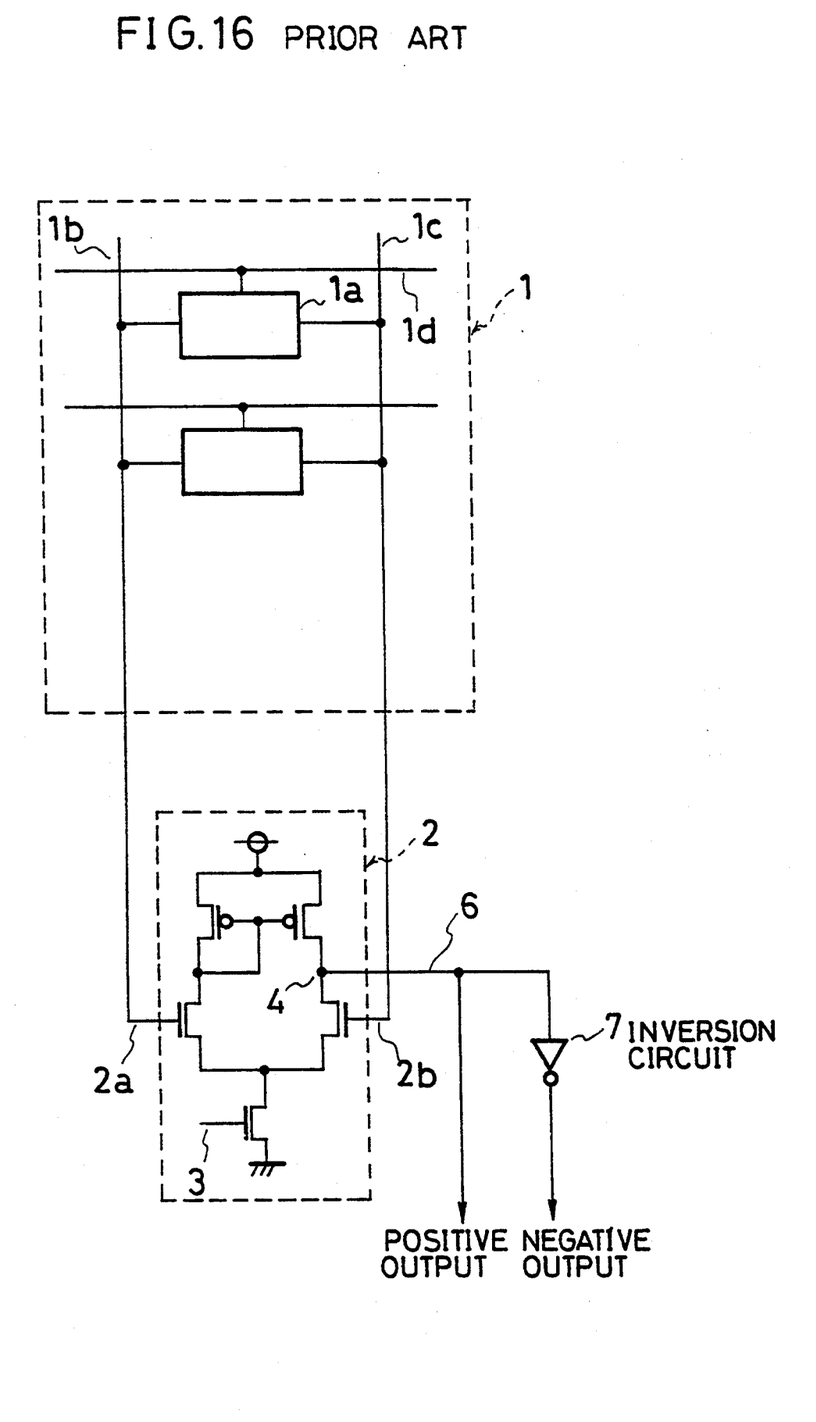
FIG. 16 shows an arrangement of a conventional data memory device comprising a single sense amplifier.

In FIG. 16 there is illustrated a conventional data comparing device where a single sense amplifier is provided with respect to a single input data. In the illustration, numeral 1 represents a memory, 1a designates a memory cell for keeping data, 1b depicts a bit line, 1c denotes a bit line (opposition), and 1d is a word line. The data of the memory cell 1a is bidirectionally readable through the respective bit lines 1b and 1c, and the same data read through the bit lines 1b and 1c are in the inverted relation to each other. Further, numeral 2 represents a sense amplifier for sensing the contents of the memory 1, and 2a, 2b respectively indicate input terminals of the sense amplifier 2, i.e., a positive terminal and a negative terminal. In addition, numeral 3 is a sense signal for activating the sense amplifier 2, 4 designates an output terminal of the sense amplifier 2, 6 depicts an output signal of the sense amplifier 2, and 7 denotes an inversion circuit (inverter).

In operation, difficulty is encountered to directly determine the kind (L or H) of the stored data within the memory cell 1a because of a micropotential. Thus, the data is amplified by a sense amplifier. The description will be made hereinbelow in terms of the case that "H" is stored in the memory cell 1a. First, in response to the word line 1d being activated, the content of the memory cell 1a is read out, and "H" is transmitted to the bit line 1b and "L" is transmitted to the bit line 1c. When the sense signal 3 is activated, the sense amplifier 2 decides the "H" level of the bit line 1b and the "L" level of the bit line 1c to output the decision result to the sense amplifier output terminal 4 so that the output signal 6 indicates "H". In the case of requirement of a positive output, the following logic circuit directly derives the output signal 6, and in the case of requirement of a negative output, it derives the output of the inversion circuit 7.

Figure 17:
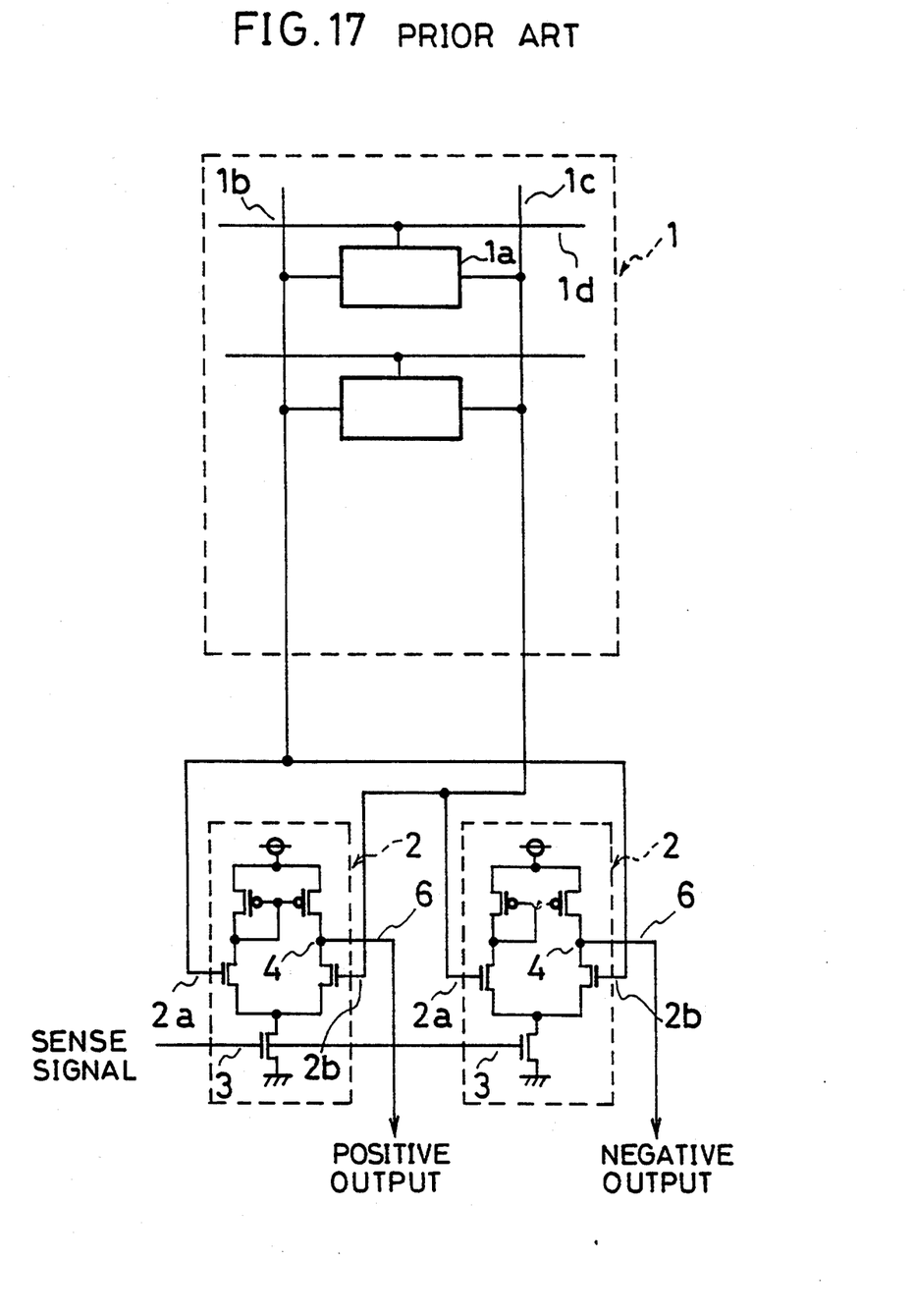
FIG. 17 is an illustration of an arrangement of a conventional data memory device using a plurality of sense amplifiers.

FIG. 17 shows a circuit arrangement where two sense amplifiers are provided. A description will be made hereinbelow only in terms of the different portions between the FIG. 17 circuit arrangement and the FIG. 16 circuit arrangement. The left-side sense amplifier 2 is for deriving the positive output signal and the right-side sense amplifier 2 is for deriving the negative output signal. That is, the left and right output signals 6 are directly derived so as to obtain positive and negative outputs.

In the case that a single sense amplifier 2 is used as illustrated in FIG. 16, in response to the requirement of the opposed output signal (inverted signal) in the following logic circuit, the output signal of the sense amplifier 2 is inverted by the inversion circuit 7 so as to obtain an inverted signal. There is a problem which arises with such an arrangement, however, in that the time is lengthened by an amount corresponding to the operation of the inversion circuit 7 so as to cause the memory access to be delayed as a whole. On the other hand, in the case that two sense amplifiers are used as illustrated in FIG. 17, since the left-side sense amplifier 2 for the positive output signal and the right-side sense amplifier 2 for the negative output signal simultaneously operate, the current value for the left and right-side amplifiers 2 doubles.

SUMMARY OF THE INVENTION

It is therefore an object of the present invention to eliminate the above-described problems and to quickly obtain either positive or negative signal with a single sense amplifier being provided with respect to a single input signal.

Another object of the present invention is to provide a comparing device which is capable of quickly performing the coincidence detection between the data outputted from a memory and the comparison data given from an internal or external.

According to the present invention, there are provided a memory cell for outputting stored data as positive logical data and negative logical data, a positive sense amplifier for inputting the positive logical data to output the positive logic result, a negative sense amplifier for inputting the negative logical data to output the logic result, and an activating circuit for controlling the positive and negative sense amplifiers to which the sense signal is inputted.

Preferably, also included are a coincidence signal outputting circuit for performing the comparison between the positive logic result and the negative logic result to output a coincidence or non-coincidence result, and a selection circuit responsive to the sense signal for controlling the activating circuit so as to operate either the positive sense amplifier or negative sense amplifier. Or, included is an output selection circuit responsive to the sense signal for selecting one of the positive logic result from the positive sense amplifier and the negative logic result from the negative sense amplifier.

The above and other objects, features, and advantages of the Invention will become more apparent from the following description when taken in conjunction with the accompanying drawings.

DESCRIPTION OF THE PREFERRED EMBODIMENT

Figure 1:
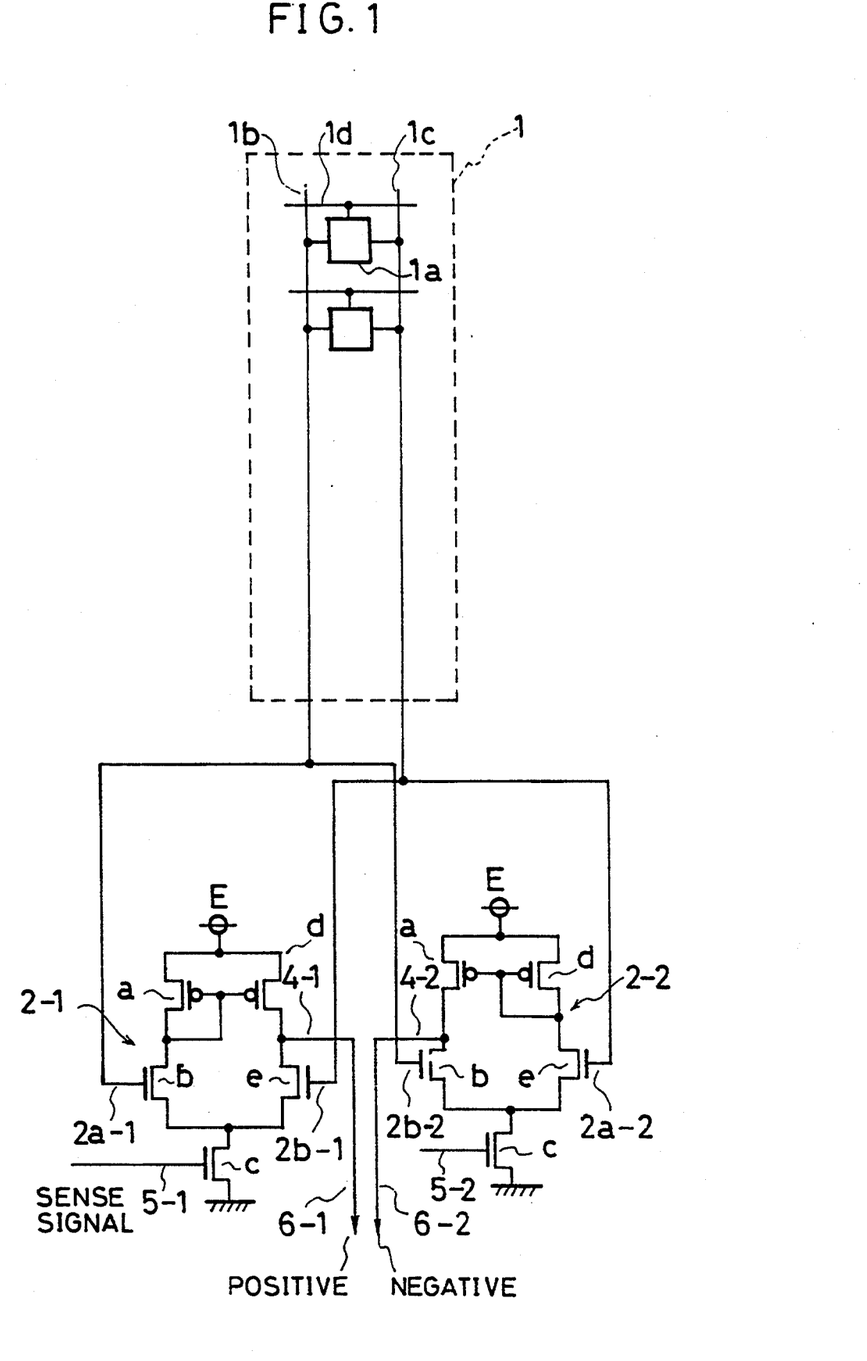
FIG. 1 is a block diagram showing an arrangement of a sense amplifier constituting a semiconductor integrated circuit according to the present invention.

A description will be made hereinbelow with reference to the drawings in terms of a first embodiment. In the drawings, parts corresponding to those in FIG. 17 are indicated with the same marks. FIG. 1 is a block diagram showing an arrangement of a sense amplifier according to the present invention. In the illustration, numeral 2-1 represents a positive sense amplifier having a positive terminal 2a-1 for inputting positive logical data and a negative terminal 2b-1 for inputting negative logical data so as to output the positive logical data, 2-2 designates a negative sense amplifier having a positive terminal 2a-2 for inputting negative logical data and a negative terminal 2b-2 for inputting positive logical data so as to output the negative logical data, 4-1 and 4-2 are respectively output terminals of the positive sense amplifier 2-1 and the negative sense amplifier 2-2, 5-1 depicts a sense signal produced in an external or internal circuit to make effective the positive sense amplifier 2-1, 5-2 denotes a sense signal produced in an external or internal circuit to make effective the negative sense amplifier 2-2, 6-1 and 6-2 are respectively the positive and negative output signals of the positive sense amplifier 2-1 and negative sense amplifier 2-2, and characters a to e are FET transistors, respectively.

Figure 2:
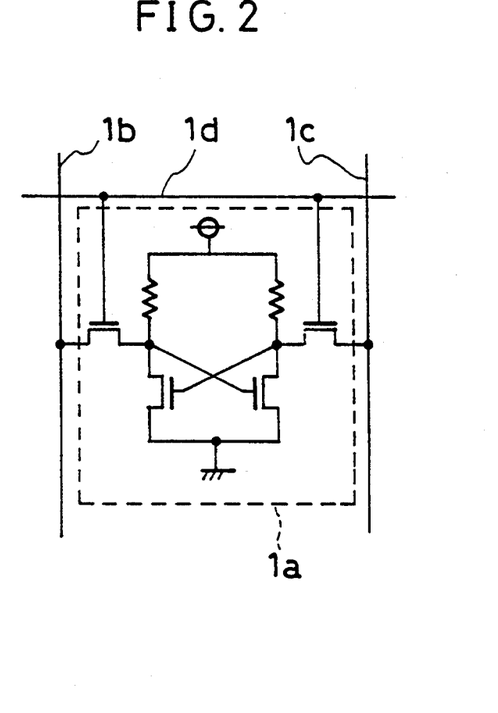
FIG. 2 shows an arrangement of a high-resistance type SRAM.
Figure 3:
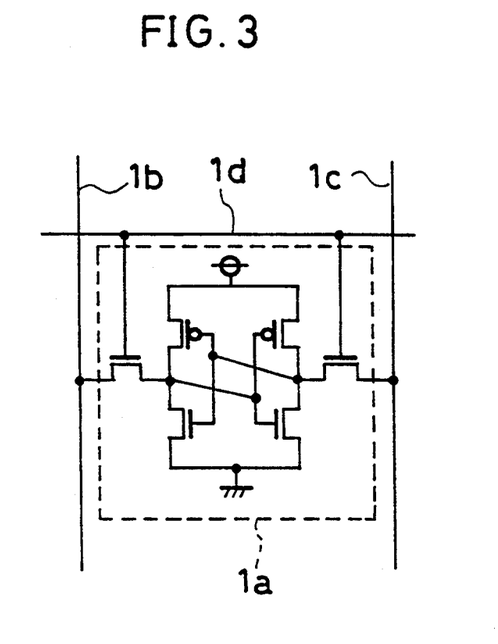
FIG. 3 shows an arrangement of a full CMOS type SRAM.
Figure 4:
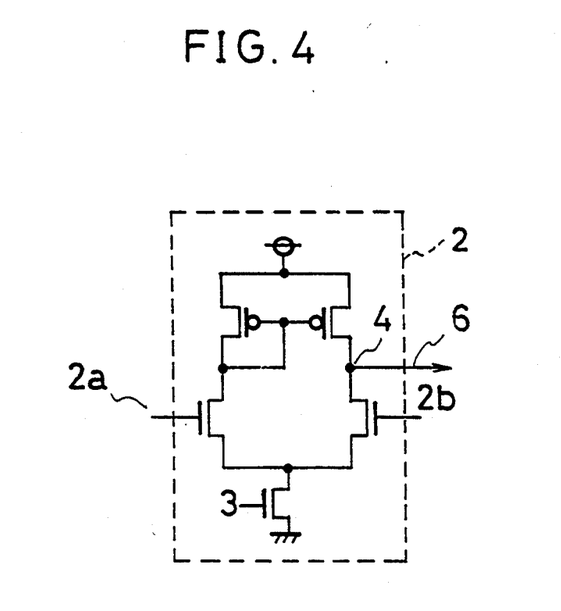
FIG. 4 illustrates an arrangement of a current-mirror type sense amplifier.
Figure 5:
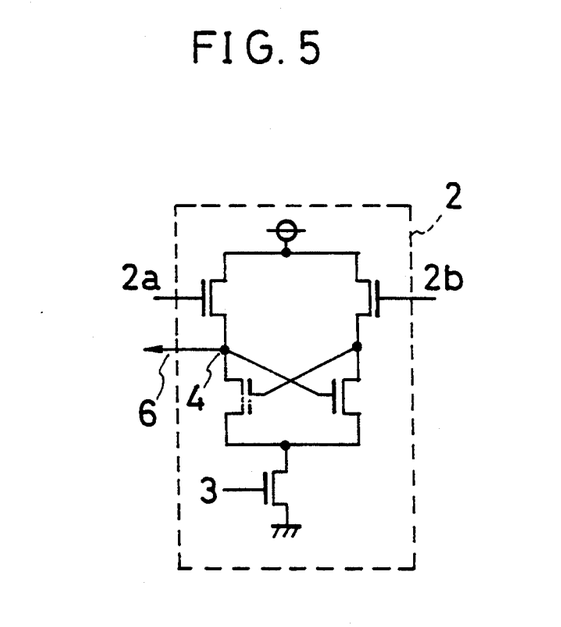
FIG. 5 is an illustration of an arrangement of a cross-couple type sense amplifier.

FIGS. 2 and 3 are illustrations of a memory cell 1a in FIG. 1, FIG. 2 showing a high-resistance type memory cell and FIG. 3 illustrating a full CMOS type memory cell. Further, FIGS. 4 and 5 are illustrations of arrangements of the sense amplifier 2 (2-1, 2-2) in FIG. 1, FIG. 4 showing a current-mirror type sense amplifier and FIG. 5 illustrating a cross-couple type sense amplifier which similarly operates.

Secondly, operation will be described hereinbelow in the case that as well as the conventional case "H" is stored in the memory cell 1a. First, when a word line 1d is activated, the contents of the memory cell 1a is read out, and "H" is transmitted to a bit line 1b and "L" is transmitted to a bit line (inversion) 1c. In response to these signals, "H" is inputted to the positive terminal 2a-1 of the positive sense amplifier 2-1 and "L" is inputted to the negative terminal 2b-1 thereof. Further, "L" is inputted to the positive terminal 2a-2 of the negative sense amplifier 2-2 and "H" is inputted to the negative terminal 2b-2 thereof. Here, when one sense signal 5-1 is asserted to be "H" and the other sense signal 5-2 is not asserted to be "L", only the positive sense amplifier 2-1 operates so as to obtain a positive output signal. Since "L" is given to the negative terminal 2b-1 of the gate of the transistor e of the positive sense amplifier 2-1, the transistor e enters into the cut state and the drain side thereof is kept to "H" due to a voltage E through the transistor d. Thus, the output signal 6-1 becomes positive (H). In this case, the transistor c is in the ON state due to the sense signal 5-1. In the negative sense amplifier 2-2, the sense signal 5-2 takes "L", and therefore the transistor c turns OFF whereby the negative sense amplifier 2-2 does not react or activate even if the positive and negative signals ("H", "L") are respectively given to the positive and negative terminals 2a-2 and 2b-2, thereby preventing the current consumption.

On the other hand, in the case that the following logic requires a negative output signal, the other sense signal 5-2 is asserted to take "H" and the one sense signal 5-1 is not asserted to be "L". Accordingly, the transistor c turns ON so that the right-side negative sense amplifier 2-2 is activated, and since "H" is given to the negative terminal 2b-2 of the transistor b, the transistor b enters into the contact state (ON state) whereby the voltage drops at the drain side to cause the output signal 6-2 to become negative (L). At this time, the positive sense amplifier 2-1 is not activated so that the current consumption is made only for the one sense amplifier 2-2 so as to be minimized.

Figure 6:
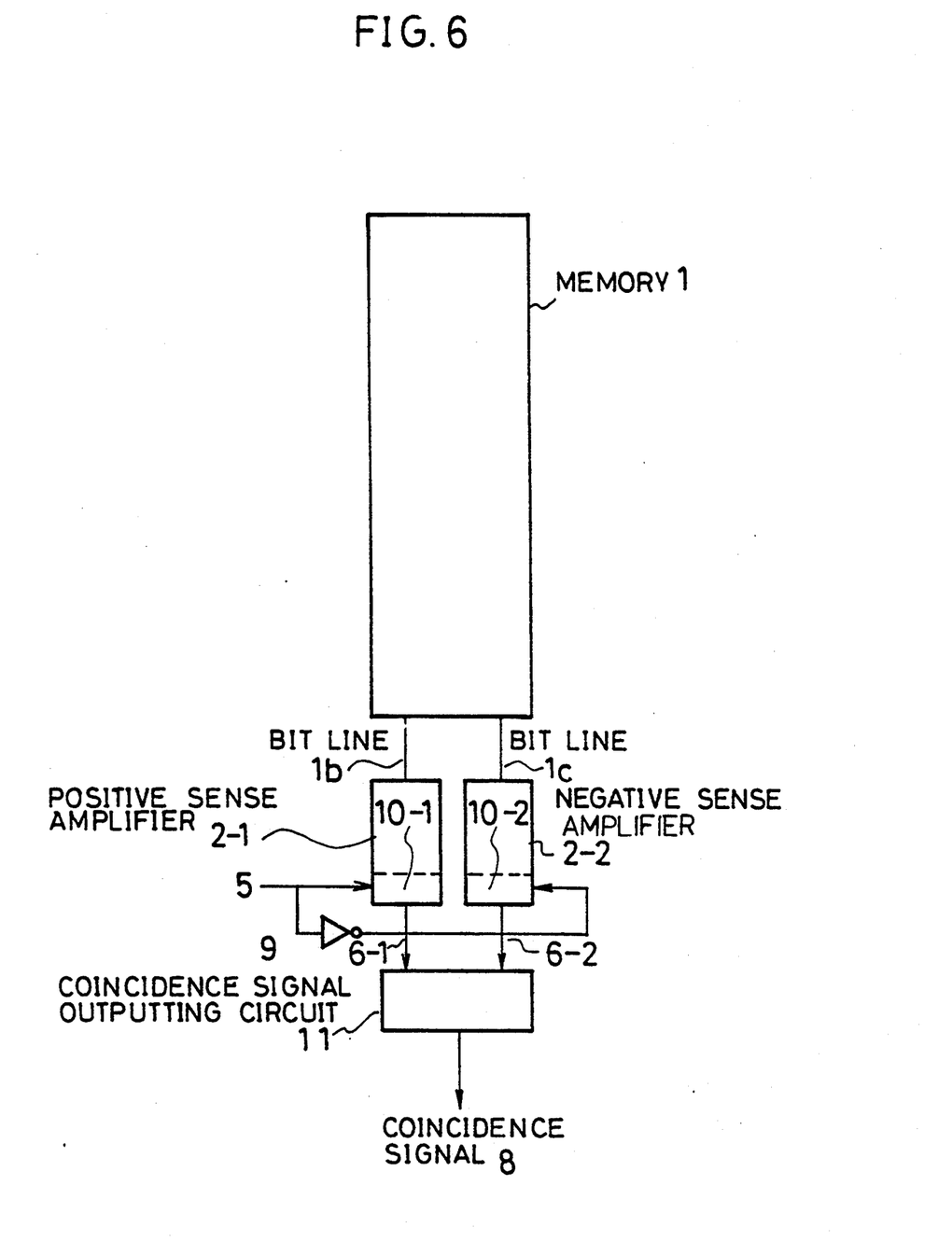
FIG. 6 is a block diagram showing a comparing device constructed as an integrated circuit having the sense amplifier arrangement according to a second embodiment.
Figure 7:
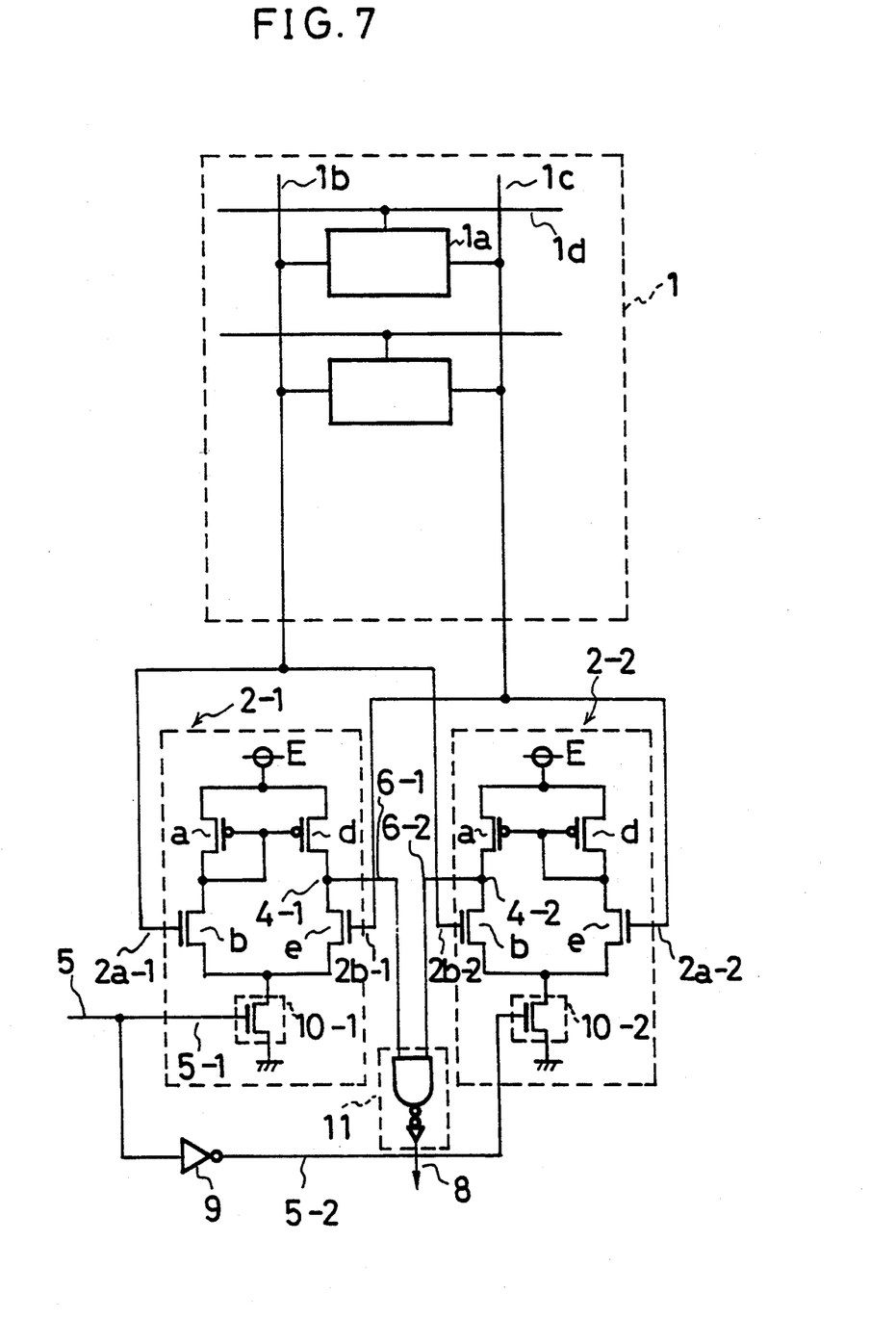
FIG. 7 shows an arrangement of the comparing circuit according to the second embodiment.

Secondly, a second embodiment of this invention will be described hereinbelow with reference to the drawings in which parts corresponding to those in FIGS. 1 to 5 and 17 are indicated with the same marks. FIG. 6 is a block diagram showing a comparing device arranged with a sense amplifier in this invention, and FIG. 7 shows a detailed arrangement of the FIG. 6 comparing device comprising a current-mirror type sense amplifier. In the illustrations, numeral 5 represents a sense signal and further, in this embodiment, represents comparison data (which will be stated thereafter as a comparison data 5) supplied from the external, 5-1 depicting positive comparison data and 5-2 denoting negative comparison data. In addition, numeral 9 is an inversion circuit responsive to the comparison data 5 to output an inverted signal thereof, and 10-1 and 10-2 denote activating circuits respectively provided in the positive and negative sense amplifiers 2-1 and 2-2 to be responsive to the positive comparison data 5-1 and the negative comparison data 5-2 to decide whether the positive sense amplifier 2-1 or negative sense amplifier 2-2 is set to be effective, two N-type transistors being used therefor. Further, 11 indicates a coincidence signal outputting circuit responsive to the output signals 6-1 and 6-2 of the positive and negative sense amplifiers 2-1 and 2-2 so as to detect that the comparison data is coincident with the data stored in the memory cell 1a, the coincidence signal outputting circuit 11 being arranged with a combination of a NAND circuit and an inversion circuit.

Secondly, operation will be described hereinbelow in the case that as well as the first-mentioned embodiment "H" is stored in the memory cell 1a. First, in response to activating the word line 1d, the contents of the memory cell 1a is read out, and "H" is transmitted to the bit line 1b and "L" is transmitted to the bit line 1c so that "H" is inputted to the positive terminal 2a-1 of the positive sense amplifier 2-1 and "L" is inputted to the negative terminal 2b-1 thereof. Further, "L" is inputted to the positive terminal 2a-2 of the negative sense amplifier 2-2 and "H" is inputted to the negative terminal 2b-2 thereof. Here, the comparison data 5 is inputted as the positive comparison data to the activating circuit 10-1 provided in the positive sense amplifier 2-1 and further inverted by the inversion circuit 9 so that the inverted data is inputted as the negative comparison data 5-2 to the activating circuit 10-2 provided in the negative sense amplifier 2-2.

In the case that the comparison data 5 is "H", since "L" is inputted to the negative terminal 2b-1, the transistor e enters into the OFF state so that the voltage drop does not occur and the output terminal 4-1 becomes "H" due to a partial voltage of the voltage E applied through the transistor d. On the other hand, since the negative comparison data 5-2 is in the "L" state and the N-type transistor of the activating circuit 10-2 is in the OFF state, the negative sense amplifier 2-2 enters into the non-operating state. Although "H" is given to the negative terminal 2b-2, since the activating circuit 10-2 is in the OFF state, the output terminal 4-2 does not cause the voltage drop. On the other hand, since a partial voltage of the voltage E is applied through the transistor a to the output terminal 4-2, the output signal 6-2 results in being "H". In response to the output signals 6-1 ("H") and 6-2 ("H") of the positive and negative sense amplifiers 2-1 and 2-2, the coincidence signal outputting circuit 11 outputs "H" as a coincidence signal 8 indicative of the fact that the contents of the memory cell 1a is coincident with the comparison data 5.

Moreover, in the case that the comparison data 5 is "L", since the positive comparison data 5-1 is "L" and the N-type transistor of the activating circuit 10-1 is in the OFF state, the positive sense amplifier 2-1 enters into the non-operating state. "H" is given to the negative terminal 2b-1 and the voltage drop does not occur because the transistor e is in the OFF state. Further, since a partial voltage of the voltage E is applied through the transistor d to the output terminal 4-1, the output signal 6-1 results in being "H". On the other hand, since the negative comparison data 5-2 is "H" and the N-type transistor of the activating circuit 10-2 turns ON, the negative sense amplifier 2-2 operates. At this time, "H" is given to the negative terminal 2b-2 to cause the transistor b to turn ON to result in the occurrence of the voltage drop, whereby the level of the output terminal 4-2 becomes "L". In response to the output signals 6-1 ("H") and 6-2 ("L") of the positive and negative sense amplifiers 2-1 and 2-2, the coincidence signal outputting circuit 11 outputs "L" as the coincidence signal 8 representative of the fact that the contents of the memory cell 1a is coincident with the comparison data 5.

Figure 8:
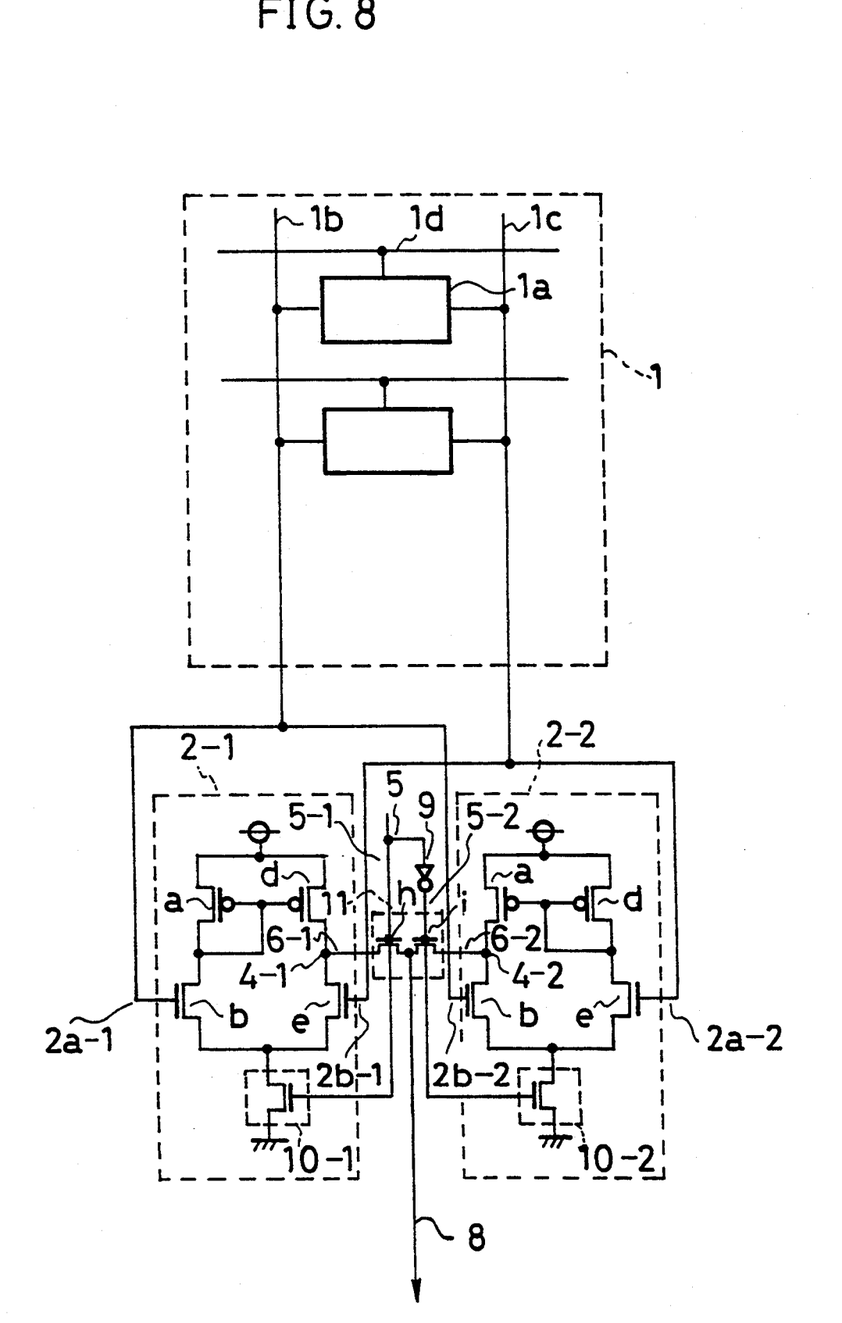
FIG. 8 illustrates another arrangement of the comparing circuit according to the second embodiment.

Here, although in FIG. 8 the positive comparison data 5-1 wiring and negative comparison data 5-2 wiring of the coincidence signal outputting circuit 11 respectively pass through the gates of transistors h and i, this merely means that the positive comparison data 5-1 is supplied to one activating circuit 10-1 and the negative comparison data 5-2 is supplied to the other activating circuit 10-2.

Furthermore, operation will be described hereinbelow in the case that as well as the above-described embodiment "H" is stored in the memory cell 1a. First, in response to the activation of the word line 1d, the contents of the memory cell 1a is read out, and "H" is transmitted to the bit line 1b and "L" is transmitted to the bit line 1c. Accordingly, "H" is inputted to the positive terminal 2a-1 of the positive sense amplifier 2-1 and "L" is inputted to the negative terminal 2b-1 thereof. In addition, "L" is inputted to the positive terminal 2a-2 of the negative sense amplifier 2-2 and "H" is inputted to the negative terminal 2b-2 thereof.

Here, the comparison data 5 is inputted as the positive comparison data 5-1 to the activating circuit 10-1 provided in the positive sense amplifier 2-1 and further inverted by the inversion circuit 9 so that the inverted data is inputted as the negative comparison data 5-2 to the activating circuit 10-2 provided in the negative sense amplifier 2-2.

In the case that the comparison data 5 is "H", since "L" is inputted to the negative terminal 2b-1, the transistor e turns OFF so as to prevent the occurrence of the voltage drop, and the output terminal 4-1 becomes "H" due to a partial voltage of the voltage E applied through the transistor d. On the other hand, since the negative comparison data 5-2 is "L" and the N-type transistor of the activating 10-2 is in the OFF state, the negative sense amplifier 2-2 enters into the non-operating state. Although "H" is given to the negative terminal 2b-2 thereof, because the activating circuit 10-2 is in the OFF state, the transistor b does not enter into the ON state, thereby preventing the voltage drop in the output terminal 4-2. Further, since the a partial voltage of the voltage E is applied through the transistor a to the output terminal 4-2, the output signal 6-2 results in being "H". In response to the output signals 6-1 ("H") and 6-2 ("H") of the positive and negative sense amplifiers 2-1 and 2-2, the coincidence signal outputting circuit 11 outputs "H" as a coincidence signal 8 indicative of the fact that the contents of the memory cell 1a is coincidence with the comparison data 5.

Furthermore, in the case that the comparison data 5 is "L", since the positive comparison data 5-1 is "L" and the N-type transistor of the activating circuit 10-1 is in the OFF state, the positive sense amplifier 2-1 takes the non-operating state. "L" is given to the negative terminal 2b-1 and hence the transistor e turns OFF to prevent the voltage drop. In addition, since a partial voltage of the voltage E is applied through the transistor d to the output terminal 4-1, as a result the output signal 6-1 becomes "H". On the other hand, since the negative comparison data 5-2 is "H" and the N-type transistor of the activating circuit 10-2 turns ON, the negative sense amplifier 2-2 takes the operation state. At this time, "H" is given to the negative terminal 2b-2 to cause the transistor b to turn ON to lead to the occurrence of the voltage drop so that the level of the output terminal 4-2 becomes "L". In response to the output signals 6-1 ("H") and 6-2 ("L") of the positive and negative sense amplifiers 2-1 and 2-2, the coincidence signal outputting circuit 11 outputs "L" as the coincidence signal 8 representative of the fact that the contents of the memory cell 1a is not coincident with the comparison data 5.

Operation of the coincidence signal outputting circuit 11 will be described hereinbelow with reference to FIG. 12. First, when the positive comparison data 5-1 is "H", the negative comparison data 5-2 is "L", the output signal 6-1 is "H", and further the output signal 6-2 is "H", the transistor h turns ON and the transistor i turns OFF. Thus, the output signal 6-1 is outputted through the transistor h and hence the coincidence signal 8 becomes "H". On the other hand, when the positive comparison data is "L", the negative comparison data is "H", the output signal 6-1 is "H", and further the output signal 6-2 is "L", the transistor h turns OFF and the transistor i turns ON. Thus, the output signal 6-2 is outputted through the transistor i and hence the coincidence signal 8 becomes "L". Here, the decision as to whether the coincidence signal is outputted as "H" or "L" is made in accordance with either the positive logic or negative logic required by the following logical circuit. As a result, only one sense amplifier is operated, thereby achieving the object of the present invention which is for minimizing the power consumption.

Figure 9:
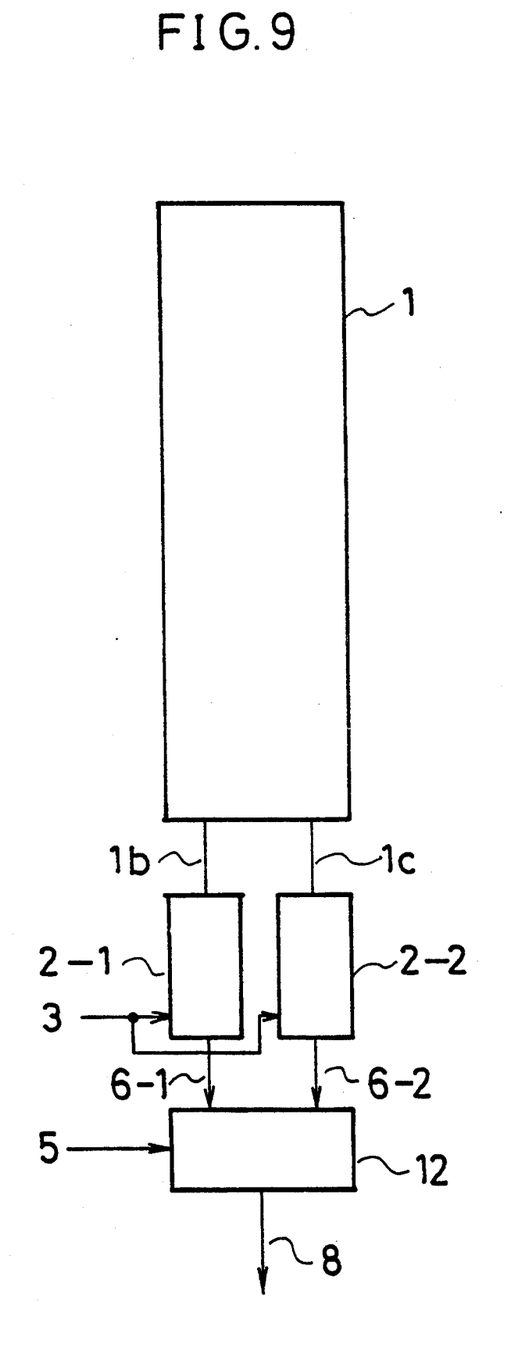
FIG. 9 is a block diagram showing a comparing circuit which is an integrated circuit according to a third embodiment.
Figure 10:
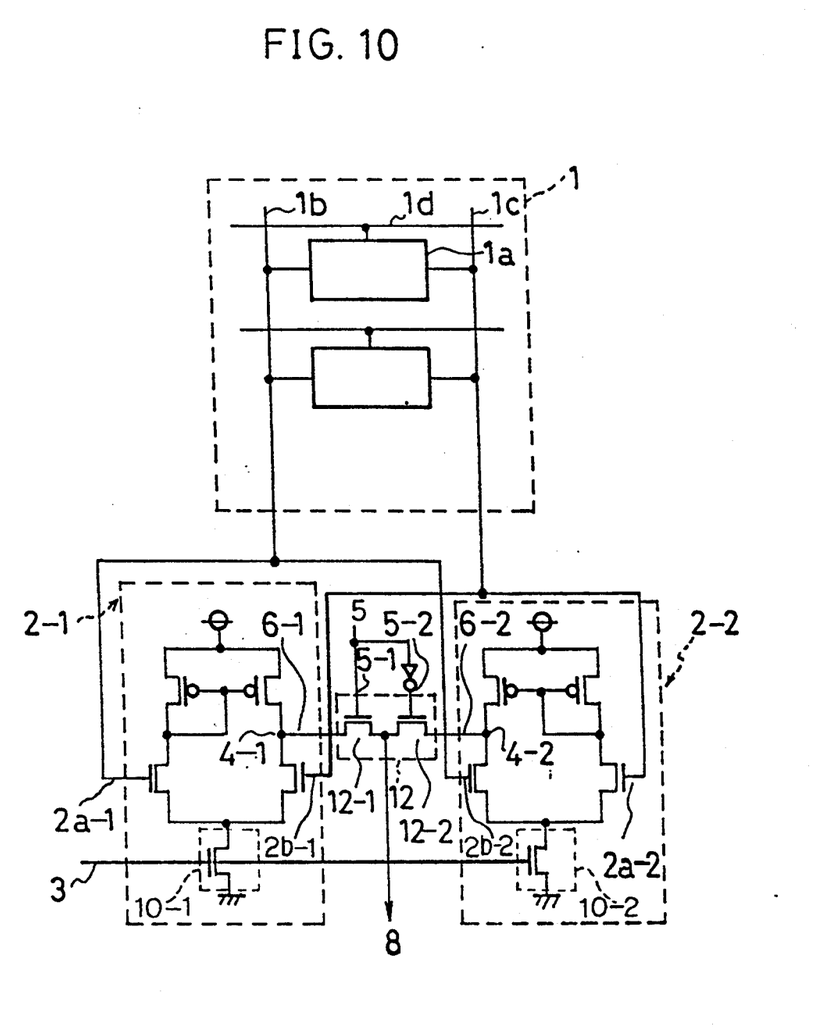
FIG. 10 shows an arrangement of the FIG. 9 comparing circuit.

Still further, a third embodiment of the present invention will be described hereinbelow with reference to the drawings where parts corresponding to those in FIGS. 1 to 8 and 17 are indicated by the same marks. FIG. 9 is a block diagram showing a comparing device according to the third embodiment, and FIG. 10 is an illustration of a detailed arrangement of the FIG. 9 comparing device. In FIGS. 9 and 10, numeral 12 represents a selection circuit comprising a N-type transistor 12-1 one end portion of which is coupled to the output terminal 4-1 of the positive sense amplifier 2-1 and the gate of which is arranged to be responsive to the positive comparison data 5-1 and another N-type transistor 12-2 one end portion of which is coupled to the output terminal 4-2 of the negative sense amplifier 2-2 and the gate of which is arranged to be responsive to the negative comparison data 5-2, terminals of the N-type transistors 12-1 and 12-2 are connected to each other so that the node of the junction point therebetween becomes an output. The output of the selection circuit 12 illustrated at numeral 8 is a coincidence signal showing the comparison result between the data stored in the memory cell and the comparison data 5. Further, numeral 3 denotes a sense signal to be applied to the gate of a FET transistor.

Operation will be described hereinbelow in the case that as well as the above-described embodiment "H" is stored in the memory cell 1a. Similarly, "H" is transmitted to the bit line 1b and "L" is transmitted to the bit line (inversion) 1c. Further, "H" is inputted to the positive terminal 2a-1 of the positive sense amplifier 2-1, "L" is inputted to the negative terminal 2b-1 thereof, and further "L" is inputted to the positive terminal 2a-2 of the negative sense amplifier 2-2, "H" is inputted to the negative terminal 2b-2. When the sense signal becomes active, both the sense amplifiers 2-1 and 2-2 in this embodiment respectively take the comparison-operating states, and the output terminal 4-1 of the positive sense amplifier 2-1 becomes "H" and the output terminal 4-2 of the negative sense amplifier 2-2 becomes "L". Here, in the case that the comparison data 5 is "H", the positive comparison data 5-1 is "H" and the negative comparison data 5-2 is "L", and further the N-type transistor 12-1 of the selection circuit 12 turns ON and the N-type transistor 12-2 thereof turns OFF, whereby "H" of the output terminal 4-1 of the positive sense amplifier 2-1 is outputted as a coincidence signal 8 representative of the coincidence between the memory contents "H" and the comparison data "H".

Moreover, in the case that the comparison data 5 is "L", the positive comparison data 5-1 is "L" and the negative comparison data 5-2 is "H". The N-type transistor 12-1 of the selection circuit 12 turns OFF and the N-type transistor 12-2 thereof turns ON, whereby "L" of the output terminal 4-2 of the negative sense amplifier 2-2 is outputted as a coincidence signal 8 indicative of no coincidence between the memory contents "H" and the comparison data "L". Similarly, the positive or negative state of the data stored in the memory cell 1a can instantaneously be detectable.

Although in the above description the sense amplifier is of the current-mirror type as illustrated in FIG. 4, it is appropriate to use the cross-couple type sense amplifier as illustrated in FIG. 5 or the like as the sense amplifier.

Figure 11:
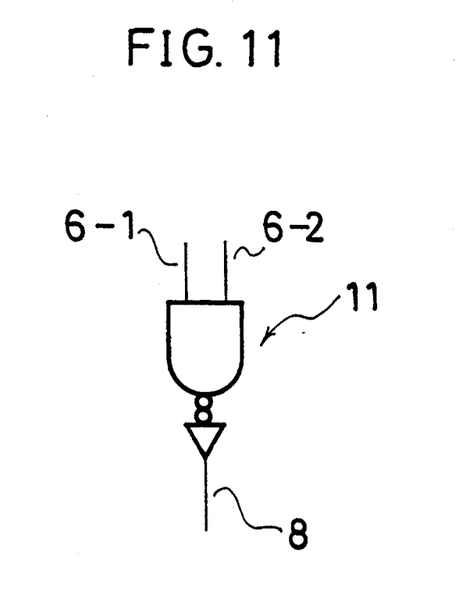
FIG. 11 is an illustration of an arrangement of a coincidence signal outputting circuit 11.
Figure 12:
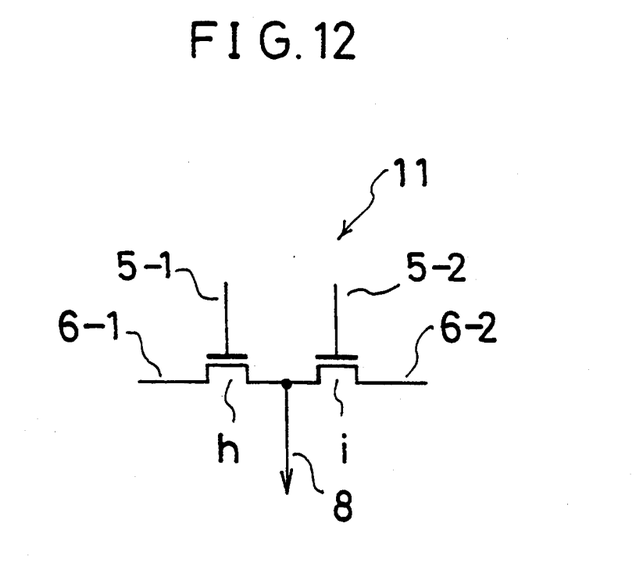
FIG. 12 is an illustration of another arrangement of the coincidence signal outputting circuit 11.
Figure 13:
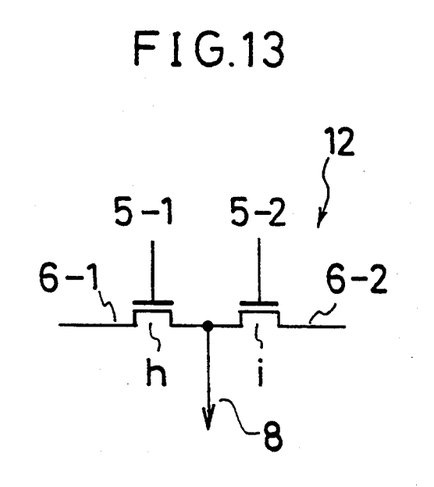
FIG. 13 shows an arrangement of a section circuit 12.
Figure 14:
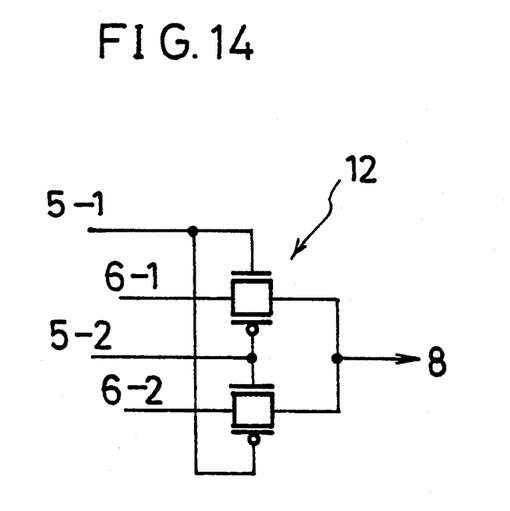
FIG. 14 illustrates another arrangement of the selection circuit 12.

Further, although in the second embodiment the coincidence signal outputting circuit 11 is composed of the tow-input NAND circuit and the inversion circuit as illustrated in FIG. 11, it is also appropriate to use an N-type FET transistor as shown in FIG. 12 or to use a different circuit arrangement which is capable of outputting a signal indicative of the fact that the output signal of the sense amplifier activated is effective. Still further, although in the third embodiment the selection circuit 12 is composed of two N-type transistors as shown in FIG. 13, it is also appropriate to use P- and N-type FET transistors which are in opposed relation to each other and which are coupled in series to each other as illustrated in FIG. 14, or to use a different circuit arrangement which is arranged to select one of two input signals.

A description will be made hereinbelow in terms of the case that a semiconductor integrated circuit according to the present invention is applied to a TAG memory. The TAG memory is a memory having a comparison function which is arranged to store a TAG portion of the input addresses in advance to compare the TAG portion of the input addresses with TAG data stored in a cache memory at the time of data retrieval (comparison operation) to decide whether both are coincident with each other. This is used for deciding the cache hit and cache miss of the data stored in the cache memory.

Figure 15:
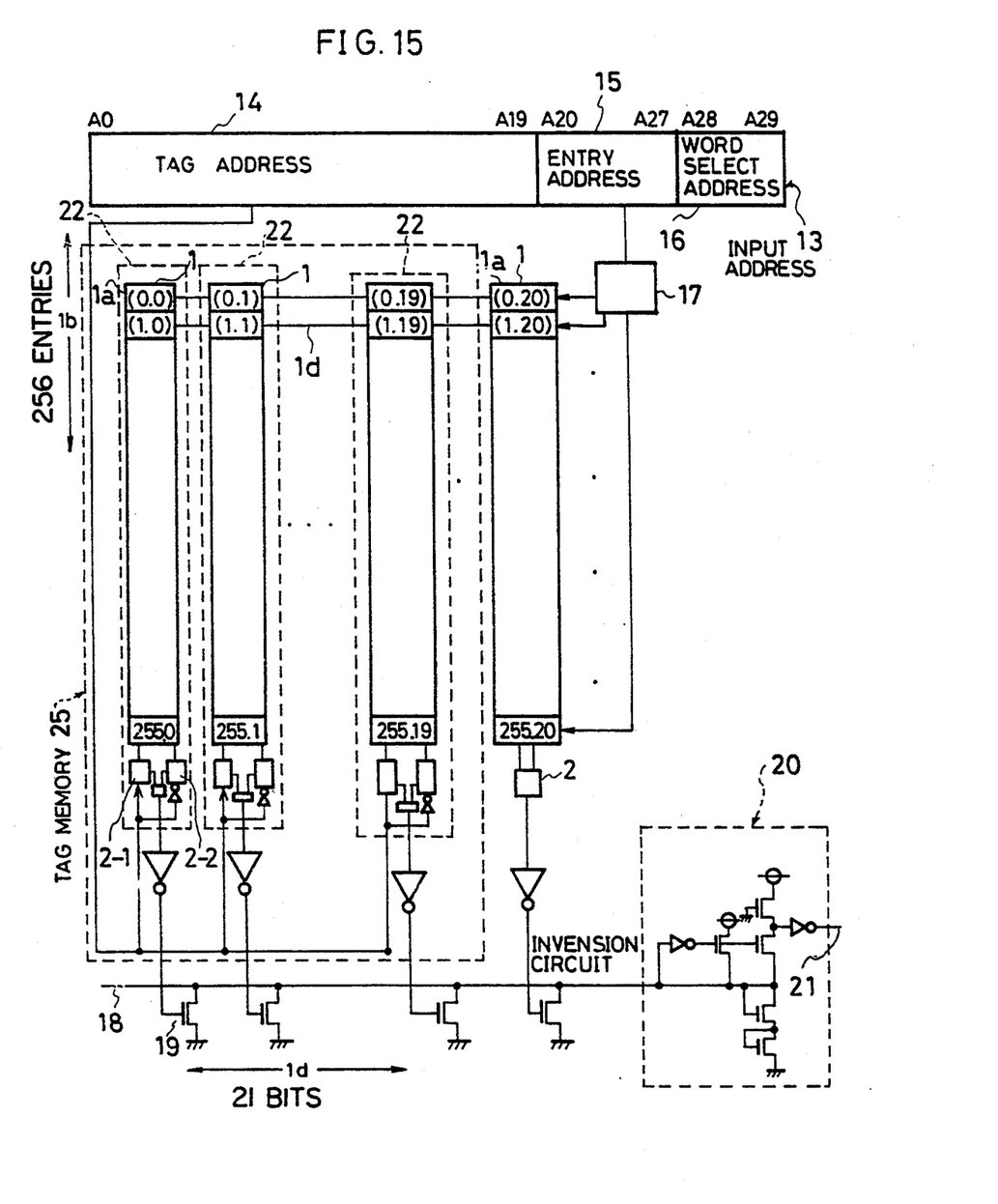
FIG. 15 shows an embodiment of a TAG memory using the comparing device according to this invention.

FIG. 15 illustrates an embodiment of a TAG memory comprising a comparing device constituting the semiconductor device according to this invention. In the illustration, numeral 13 represents an input address comprising 30 bits (A0 to A29) stored in a given register, 14 designates a TAG address which is a portion of the input address 13 and which comprises the high-order 20 bits (A0 to A19), 15 denotes an entry address which is a portion of the input addresses 13 and which comprises 8 bits (A20 to A27), 16 depicts a word-select address which is a portion of the input addresses 13 and which comprises 2 bits (A28, A29), 17 indicates an entry decoder for decoding the entry address 15, 19 is a discharge transistor whose gate inputs a comparison result signal 8 of each comparing device and whose one end portion is coupled to a GND, and 18 represents a match line coupled to the other end portion of the discharge transistor 18. Further, 20 designates a sense amplifier for hit decision which senses the level of the match line 18 and 21 is a hit signal. In addition, numeral 22 are comparing devices according to this invention whose number is 20 respectively corresponding to the bits Ao to A19 in the TAG address 14, so that the 20 bits of the TAG address 14 are respectively given as comparison data to the 20 comparing devices 22 at the time of the comparing operation. Further, numeral 25 represents a TAG memory comprising the 20 comparing devices 22.

Here, the TAG memory 25 comprises 256×21 bits, i.e., 256 bits in the directions of the bit lines 1b and 21 bits in the directions of the word lines 1d. A train of 21 memory cells coupled to one word line is so-called entry. As illustrated in FIG. 15, the memory for storing the TAG memory is composed of 256 entries ×20 bits. The 21th-bit memory (0.20) to (255; 20) is used for the valid bit which shows the fact that the entry is effective or ineffective. The comparison between the stored data and the retrieval data is performed with 20 bits (0 to 19), and hence 20 pairs of sense amplifiers each having the comparison function are used. The valid bit (21th bit) is for directly reading out the stored data. That is, a pair of positive and negative sense amplifiers 2 are provided with respect to each bit train, thereby using the total 20 pairs of positive and negative sense amplifiers 2 which respectively correspond to the Bits A0 to A19 in the TAG address. The remaining one bit train is the valid bit train for showing the fact that the corresponding entry is effective. To directly read out the valid-bit data, the sense amplifier 2 is constructed to be a general current-mirror type sense amplifier or cross-couple type sense amplifier as illustrated in FIGS. 4 and 5.

Secondly, the comparing operation will be described hereinbelow. In response to input of the address 13 with 30 bits, the 8-bit entry address 15 is decoded by the entry decoder 17 to select one corresponding entry of the 256 (2⁸) entries. The word line 1d for the selected entry becomes active so that the TAG data of the entry comprising 20 memory cells 1a are supplied to the respective sense amplifiers. Now let it be assumed that the valid bit of the selected entry is set to be "1" indicative of the effectiveness and all the 20 bits are "1" in the stored TAG data. If at least one bit of the TAG address 14 of the input address 13 is "0", the bit causes no coincidence, and hence "L" is outputted and the non-coincidence signal becomes "H" through the inversion circuit so as to be inputted to the gate of the discharge transistor 19. In response to the input of "H", the discharge transistor 19 enters into the ON state, and therefore the level of the match line 18 lowers. This level is detected by a hit-decision sense amplifier 20 so as to output "H" as a hit signal 21 representative of the miss. As described above, in the case that the stored TAG data is compared with the inputted TAG address 14, even if at least one bit is in the non-coincident state, the level of the match line 18 lowers whereby the hit signal 21 is indicative of the miss.

On the other hand, if the all the bits of the TAG address 14 of the input address 13 are "1", all the bits are in the coincidence states, and therefore the coincidence signal is inputted as "L" through the inversion circuit to the discharge transistor 19. Further, since the output signal from the valid bit is also "H", "L" is inputted through the inversion circuit to the discharge transistor 19. Thus, all the discharge transistors turn OFF, and hence the level of the match line 18 does not lower but the match line 18 keeps a constant level which depends upon the hit decision sense amplifier 20. With this level, the hit decision sense amplifier 20 outputs "L" as the hit signal 21 which is indicative of the hit.

Here, although in the embodiment the coincidence signal of the comparing device 22 is "H" in the case of the coincidence and is "L" in the case of no coincidence, it is also appropriate to be arranged such that it is "L" when the comparison result shows the coincidence and is "H" when the comparison result shows the no coincidence. In this case, it is possible to omit the inversion circuit. In addition, although the pull-up of the match line 18 is arranged to be effected by the hit decision sense amplifier 20, it is appropriate to be arranged to pull up the match line 18 immediately before the comparing operation.

As described above, according to the present invention, there are provided the memory cell from which the stored data are outputted as the positive and negative logical data, the positive sense amplifier responsive to the positive logical data to output the positive logical result, the negative sense amplifier responsive to the negative logical data to output the negative logical result, and the activating circuit responsive to the sense signal to control the positive and negative sense amplifiers. This arrangement allows providing a sense amplifier system which permits a high-speed operation and a low current consumption. Further, according to this invention, there are provided the coincidence signal outputting circuit for comparing the positive logical result with the negative logical result to output a result indicative of the coincidence or no coincidence, the selection circuit responsive to the sense signal to control the activating circuit to operate one of the positive sense amplifier and negative sense amplifier. In addition, according to this invention, there is provided the output selection circuit responsive to the sense signal to select one of the positive logical result from the positive sense amplifier and the negative logical result from the negative sense amplifier. Thus, the comparing operation between the data stored in the memory and the comparison data can be performed at a high speed.

What is claimed is:

1. A semiconductor integrated circuit comprising:
  a memory cell whereby stored data are output as non-inversion logical data and inversion logical data;
  a true sense amplifier responsive to said non-inversion logical data to output a non-inversion logical result;
  an inversion sense amplifier responsive to said inversion logical data to output an inversion logical result;
  an activating and selection circuit responsive to a sense signal
    (a) for controlling and selecting one of said non-inversion sense amplifier or said inversion sense amplifier to output one of said non-inversion logical data or said inversion logical data respectively as a selected logical result and
    (b) for causing an output terminal of a remaining one of said non-inversion sense amplifier or said inversion sense amplifier to be at a given potential;
  wherein said activating and selection circuit activates only one of said non-inversion sense amplifier or said inversion sense amplifier; and
  an output selection circuit responsive to said sense signal to select one of said non-inversion logical result from said non-inversion sense amplifier or said inversion logical result from said inversion sense amplifier.

2. A semiconductor integrated circuit comprising:
  a memory cell whereby stored data are output as non-inversion logical data and inversion logical data;
  a non-inversion sense amplifier responsive to said non-inversion logical data to output a non-inversion logical result;
  an inversion sense amplifier responsive to said inversion logical data to output an inversion logical result;
  an activating circuit and a selection circuit responsive to a sense signal
    (a) for controlling and selecting one of said non-inversion sense amplifier or inversion sense amplifier to output one of said non-inversion logical data or said inversion logical data respectively as a selected logical result; and
    (b) for causing an output terminal of a remaining one of said non-inversion sense amplifier or said inversion sense amplifier to be at a given potential;

wherein said activating and selection circuit activates only one of said non-inversion sense amplifier or said inversion sense amplifier; and a coincidence signal circuit for comparing said selected logical result with said given potential to output a signal indicative of a coincidence or no coincidence therebetween.

3. A semiconductor integrated circuit for comparing data stored in a memory cell with a sense signal as comparison data, comprising:
- a memory cell whereby stored data are output as non-inversion logical data and inversion logical data;
- a non-inversion sense amplifier responsive to said non-inversion logical data to output a non-inversion logical result;
- an inversion sense amplifier responsive to said inversion logical data to output an inversion logical result; and
- activating circuits, provided on each of said non-inversion sense amplifier and said inversion sense amplifier, wherein each of said activating circuits are independently operated by the sense signal.

4. A semiconductor integrated circuit for comparing data stored in a memory cell with a sense signal as comparison data comprising:
- a memory cell whereby stored data are output as non-inversion logical data and inversion logical data;
- a non-inversion sense amplifier responsive to said non-inversion logical data to output a non-inversion logical result;
- an inversion sense amplifier responsive to said inversion logical data to output an inversion logical result;
- activating circuits, provided on each of said non-inversion sense amplifier and said inversion sense amplifier wherein each of said activating circuits are independently operated by the sense signal;
- a selection circuit wherein said activating circuits and said selection circuit are both responsive to the sense signal;
  (a) for controlling and selecting one of said non-inversion sense amplifier or inversion sense amplifier to output one of said non-inversion logical data or said inversion logical data respectively as a selected logical result;
  (b) for causing an output terminal of one of said non-inversion sense amplifier or inversion sense amplifier to be at a given potential; and
  (c) for activating only one of said non-inversion sense amplifier or said inversion sense amplifier; and
- an output selection circuit responsive to said sense signal to select one of said non-inversion logical result from said non-inversion sense amplifier or said inversion logical result from said inversion sense amplifier.

5. A semiconductor integrated circuit for comparing data stored in a memory cell with a sense signal as comparison data, comprising:
- a memory cell whereby stored data are output as non-inversion logical data and inversion logical data;
- a non-inversion sense amplifier responsive to said non-inversion logical data to output a non-inversion logical result;
- an inversion sense amplifier responsive to said inversion logical data to output an inversion logical result;
- activating circuits, provided on each of said non-inversion sense amplifier and said inversion sense amplifier, wherein each of said activating circuits are independently operated by the sense signal;
- a selection circuit;
- wherein said activating circuits and said selection circuit are both responsive to the sense signal;
  (a) for controlling and selecting one of said non-inversion sense amplifier or inversion sense amplifier to output one of said non-inversion logical data or said inversion logical data respectively as a selected logical result;
  (b) for causing an output terminal of said non-inversion sense amplifier or said inversion sense amplifier to be at a given potential; and
  (c) for activating only one of said non-inversion sense amplifier or said inversion sense amplifier; and
- a coincidence signal circuit for comparing said selected logical result with said given potential to output a signal indicative of a coincidence or no coincidence therebetween.

* * * * *